United States Patent
Eggers et al.

(10) Patent No.: US 9,746,539 B2
(45) Date of Patent: Aug. 29, 2017

(54) MR IMAGING WITH SUPPRESION OF FLOW ARTIFACTS

(71) Applicant: KONINKLIJKE PHILIPS N.V., Eindhoven (NL)

(72) Inventors: Holger Eggers, Hamburg (DE); Peter Börnert, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 589 days.

(21) Appl. No.: 14/367,464

(22) PCT Filed: Nov. 26, 2012

(86) PCT No.: PCT/IB2012/056748
§ 371 (c)(1),
(2) Date: Jun. 20, 2014

(87) PCT Pub. No.: WO2013/093674
PCT Pub. Date: Jun. 27, 2013

(65) Prior Publication Data
US 2014/0368195 A1    Dec. 18, 2014

Related U.S. Application Data

(60) Provisional application No. 61/579,725, filed on Dec. 23, 2011.

(51) Int. Cl.
*G01R 33/565* (2006.01)
*G01R 33/48* (2006.01)
(Continued)

(52) U.S. Cl.
CPC ..... *G01R 33/56563* (2013.01); *G01R 33/385* (2013.01); *G01R 33/4828* (2013.01);
(Continued)

(58) Field of Classification Search
CPC ............ G01R 33/56563; G01R 33/385; G01R 33/4828; G01R 33/56509; G01R 33/56527; G01R 33/5616
See application file for complete search history.

(56) References Cited

U.S. PATENT DOCUMENTS 5,070,876 A    12/1991  Wright
5,170,122 A    12/1992  Bernstein
(Continued)

OTHER PUBLICATIONS

Reeder, S.B. et al "Quantification and Reduction of Ghosting Artifacts in Interleaved Echo-Planar Imaging", Magnetic Resonance in Medicine, vol. 38, No. 3, Sep. 1997, pp. 429-439.
(Continued)

*Primary Examiner* — Gregory H Curran

(57) ABSTRACT

At least two gradient echo signals are generated at two different echo times by subjecting a portion of a body (10) in an MR examination region (1) to an imaging sequence of RF pulses and switched magnetic field gradients. The 0th moment of the readout magnetic field gradient essentially vanishes at the time of a first gradient echo while the 1st moment of the readout gradient is non-zero. Both the 0th and 1st moments of the readout magnetic field gradient essentially vanish at a time of a second gradient echo. Gradient echo signals are acquired. Acquiring the gradient echo signals is repeated for a plurality of phase encoding steps. A first MR image is reconstructed from the gradient echo signals of the first gradient echo and a second MR image is reconstructed from the gradient echo signals of the second gradient echo. Ghosting artefacts in the first and/or second MR image are identified by comparing the first and second MR images.

11 Claims, 3 Drawing Sheets

(51) Int. Cl.
*G01R 33/385* (2006.01)
*G01R 33/561* (2006.01)

(52) U.S. Cl.
CPC . *G01R 33/56509* (2013.01); *G01R 33/56527* (2013.01); *G01R 33/5616* (2013.01)

(56) References Cited

U.S. PATENT DOCUMENTS

| | | |
|---|---|---|
| 5,206,591 A | 4/1993 | Hausmann |
| 5,521,502 A | 5/1996 | Siegel |
| 5,891,032 A | 4/1999 | Harvey |
| 6,100,689 A | 8/2000 | Huff |
| 6,114,852 A | 9/2000 | Zhou |
| 7,440,791 B2 | 10/2008 | Deimling |
| 2008/0071167 A1 | 3/2008 | Ikedo et al. |
| 2010/0296717 A1* | 11/2010 | Takizawa ........... G01R 33/4824 382/131 |

OTHER PUBLICATIONS

"Local Software Projects/MRI Ghost Artifact Detection", Jun. 2010, pp. 1-9.

Machida, Y. et al "Effects of Gradient Moment Nulling in 3D Half-Fourier FSE "Bright Blood" Imaging", Proceedings of the International Society for Magnetic Resonance in Medicine, Apr. 2000, pp. 1829.

Deistung, Andreas et al "ToF-SWI: Simultaneous Time of Flight and Fully Flow Compensated Susceptibility Weighted Imaging", Journal of Magnetic Resonance Imaging, vol. 29, 2009, pp. 1478-1484.

* cited by examiner

MR IMAGING WITH SUPPRESION OF FLOW ARTIFACTS

CROSS-REFERENCE TO PRIOR APPLICATIONS

This application is the U.S. National Phase application under 35 U.S.C. §371 of International Application No. PCT/IB2012/056748, filed on Nov. 26, 2012, which claims the benefit of U.S. Provisional Patent Application No. 61/579,725, filed on Dec. 23, 2011. These applications are hereby incorporated by reference herein.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

BACKGROUND OF THE INVENTION

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the magnetic field $B_0$ extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each line is digitized by collecting a number of samples. A set of k-space data is converted to an MR image by means of Fourier transformation.

SUMMARY OF THE INVENTION

In MR imaging, it is often desired to obtain information about the relative contribution of different chemical species, such as water and fat, to the overall signal, either to suppress the contribution of some of them or to separately or jointly analyze the contribution of all of them. These contributions can be calculated if information from two or more corresponding echoes, acquired at different echo times, is combined. This may be considered as chemical shift encoding, in which an additional dimension, the chemical shift dimension, is defined and encoded by acquiring a couple of images at slightly different echo times. In particular for water-fat separation, these types of experiments are often referred to as Dixon-type of measurements. By means of Dixon imaging or Dixon water/fat imaging, a water-fat separation can be achieved by calculating contributions of water and fat from two or more corresponding echoes, acquired at different echo times. In general such a separation is possible because there is a known precessional frequency difference of hydrogen in fat and water. In its simplest form, water and fat images are generated by either addition or subtraction of the 'in phase' and 'out of phase' datasets. However, such a separation of different species based on chemical shift encoding is not restricted to water/fat species only. Other species with other chemical shifts could also be considered.

It is known that a number of artefacts can appear in a MR image acquired from a region of the examined body in which flow phenomena occur, for example an arterial blood flow. The two most striking effects of flow are a reduction of the MR signal intensity as a consequence of an incoherent addition of the phases of the individual spins in a given image element (pixel/voxel), and the formation of a number of ghosting artefacts as a consequence of the pulsating blood flow during the heart cycle. Since both mentioned effects exhibit proportionality to the $1^{st}$ time moment of the switched magnetic field gradients that are utilized, the corresponding artefacts can be reduced by means of a flow compensation by controlling the gradient switching such that the $1^{st}$ moment essentially equals zero. This type of flow compensation is sometimes referred to as gradient moment rephasing, gradient motion refocusing or gradient moment cancellation in the literature.

While the aforementioned techniques allow to mostly suppress the adverse effects of flow in MR images, they entail other problems. Most notably, the mentioned gradient moment rephasing techniques tend to require longer echo times and repetition times. This basically prohibits, among others, their use in first-pass contrast-enhanced angiography.

From the foregoing it is readily appreciated that there is a need for an improved MR imaging technique. It is consequently an object of the invention to provide a method that enables efficient compensation of flow artefacts, especially for first-pass contrast-enhanced MR angiography in combination with Dixon water/fat separation.

In accordance with the invention, a method of MR imaging of a body placed in the examination volume of a MR device is disclosed. The method comprises the steps of:

a) generating at least two gradient echo signals at two different echo times by subjecting the portion of the body to an imaging sequence of RF pulses and switched magnetic field gradients, wherein the $0^{th}$ moment of the readout magnetic field gradient essentially vanishes at the time of the first gradient echo, the $1^{st}$ moment of the readout gradient being non-zero at the time of the first gradient echo, while both the $0^{th}$ and $1^{st}$ moments of the readout magnetic field gradient essentially vanish at the time of the second gradient echo;
b) acquiring the gradient echo signals;
c) repeating steps a) and b) for a plurality of phase encoding steps;
d) reconstructing a first MR image from the gradient echo signals of the first gradient echo and a second MR image from the gradient echo signals of the second gradient echo; and
e) identifying ghosting artefacts in the first and/or second MR image by comparing the first and second MR images.

In accordance with the invention, at least two independent signal data sets are acquired, wherein the first signal data set comprises the gradient echo signals of the first gradient echo and the second signal data set comprises the gradient echo signals of the second gradient echo. The invention exploits the gradient moment rephasing effect which inherently suppresses most of the artefacts related to flow in the second signal data set. Thus, the difference between the first and second signal data sets allows to identify ghosting artefacts in the first signal data set due to flow and to correct for these artefacts accordingly. In this way, the invention permits the elimination of ghosting artefacts without prolonging the echo and repetition times in MR image acquisition.

For example, a first MR image is reconstructed from the gradient echo signals of the first gradient echo, while a second MR image is reconstructed from the gradient echo signals of the second gradient echo. Ghosting artefacts can then be identified in the first and/or second MR image by comparing the first and the second MR images. For example, ghosting artefacts can be identified on the basis of local intensity losses and/or gains in the first MR image compared with the second MR image. Once the ghosting artefacts are identified in the MR images, it is straightforward to eliminate them in the first MR image, for example by restoring lost local intensity or by clipping local excess local intensity in the first MR image.

After eliminating the ghosting artefacts in the first MR image, at least one final MR image may be computed in a preferred embodiment of the invention by combining the first and second MR images, for example in accordance with the above-mentioned Dixon technique.

It has to be noted that the terms "first gradient echo" and "second gradient echo" have to be interpreted in the broadest possible sense within the meaning of the invention, each term referring to any one of a sequence of two or more gradient echoes generated by the imaging sequence. In particular, the terms "first gradient echo" and "second gradient echo" do not necessarily imply that the two respective gradient echoes are generated in a specific temporal order. Nor must the "first gradient echo" necessarily be the initial echo in a sequence of several gradient echoes. It is further not necessary that the "first gradient echo" and the "second gradient echo" are consecutive echoes.

The gradient echo signals acquired in accordance with the invention may comprise contributions from at least two chemical species having different MR spectra, wherein the echo times are selected such that the signal contributions from the at least two chemical species are more in phase at the time of the second gradient echo than at the time of the first gradient echo. Dixon-type imaging can be applied to separate the signal contributions of the at least two chemical species (for example water and fat) such that the at least one final MR image comprises contributions from only one of the chemical species. Such Dixon methods have already been applied in MR angiography in order to eliminate the signal contributions from fat and thus to enhance the contrast between vasculature and background tissue. Dixon methods are promising candidates to replace subtraction methods as they have so far been employed for the same purpose. As explained above, Dixon methods rely on the acquisition of at least two echo signals at different echo times, wherein the signal contributions from water and fat are more in phase at the time of one of the echoes than at the time of the other echo. The Dixon method can advantageously be used in combination with the flow compensation approach of the invention, which also relies on the acquisition of (at least) two echo signals at different echo times. Dixon methods do not generally require the signal contributions from the two chemical species to be more in phase at the time of the second gradient echo than at the time of the first gradient echo. They are able to separate water and fat independent of this condition. However, the flow artefact suppression proposed by the invention takes advantage from this condition. This is because the signals of the two chemical species rephase toward the time of the second gradient time, i.e. the magnitude of the composite signal either stays constant (if only one of the chemical species is present in the respective pixel/voxel) or it increases (if both chemical species are present in the respective pixel/voxel). If the magnitude of the composite signal drops, nevertheless, this can be interpreted as an indication of a flow artefact in accordance with the invention.

It has to be noted, however, that the method of the invention may also be applied independent of Dixon methods, i.e. in all cases in which artefacts related to flow have to be eliminated.

The method of the invention may also be generalized to more than two echoes. In this case, the MR images reconstructed from the MR signals of the even gradient echoes are assumed to be free from ghosting artefacts due to the gradient moment rephasing. The ghosting artefacts will be present in the MR images reconstructed from the MR signals of the odd echoes. This difference may be translated into computation weights for a consistency evaluation as a basis for an iterative consistency enforcement. In this way, the ghosting artefacts can be suppressed in a particularly effective manner.

Moreover, known procedures for eddy current compensation, which eliminate a MR signal phase alternating between odd and even echoes, may be applied for the method of the invention to eliminate an offset in MR signal amplitude between odd and even gradient echoes.

The above-described method of the invention has not yet addressed the decreased overall image intensity at the location of flow in the first MR image. This decreased intensity may lead to signal leakage into the fat image when combining the first and second MR images according to the Dixon approach. However, if necessary, the blood vessel in which flow occurs may be detected in the water image, and signal intensity in the fat image may be restored to the water image in all affected pixels or voxels.

It has to be noted that the term "chemical species" has to be broadly interpreted in the context of the invention as any kind of chemical substance or any kind of nuclei having MR properties. In a simple example, the MR signals of two chemical species are acquired, wherein the chemical species are protons in the "chemical compositions" water and fat. In a more sophisticated example, a multi-peak spectral model actually describes nuclei in a set of different chemical compositions which occur in known relative amounts.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
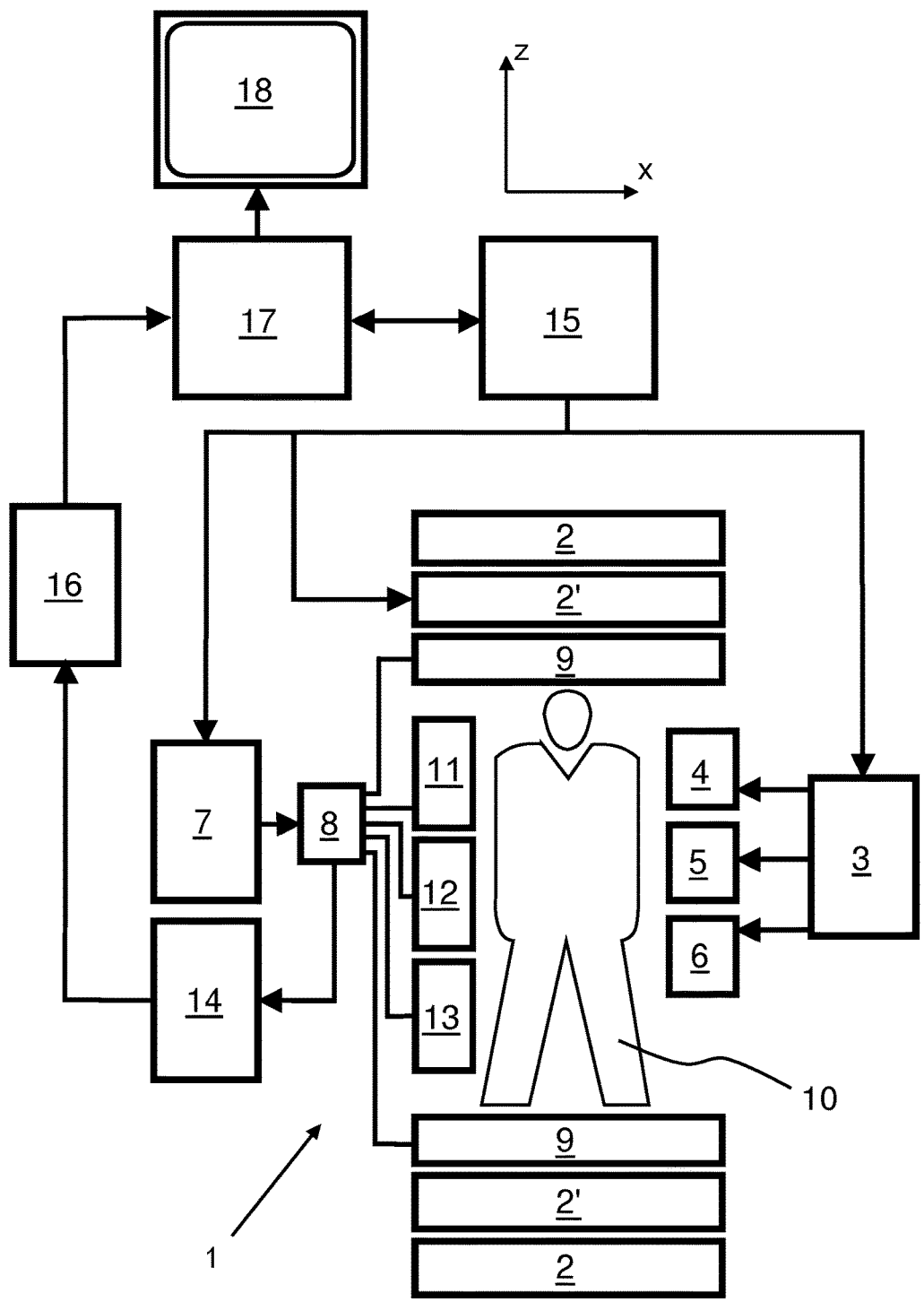
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
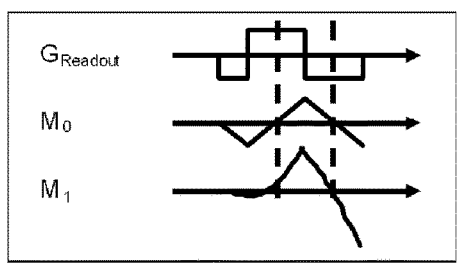
FIG. 2 illustrates the switching of the readout gradient for generation of gradient echo signals according to the invention.

In accordance with the invention, at least two gradient echo signals are generated at two different echo times, wherein the $0^{th}$ moment of the readout magnetic field gradient essentially vanishes at the time of the first gradient echo, the first moment of the readout gradient being non-zero at the time of the first gradient echo, while both the $0^{th}$ and $1^{st}$ moments of the readout magnetic field gradient essentially vanish at the time of the second gradient echo. This is schematically illustrated in FIG. 2. Shown are the readout magnetic field gradient $G_{readout}$ of the dual-echo acquisition scheme of the invention, and the $0^{th}$ moment $M_0$ and the $1^{st}$ moment $M_1$ of the readout magnetic field gradient. The $0^{th}$ moment $M_0$ vanishes at both echo times (indicated by dashed lines in FIG. 2), but the $1^{st}$ moment $M_1$ vanishes only at the second echo time. The same holds for all odd and even echoes in a multi-echo acquisition according to the invention. An inherent flow compensation of the second gradient echo is achieved due to the gradient moment rephasing effect. The $0^{th}$ moment $M_0$ of the readout magnetic field gradient is defined as the integral of the readout magnetic field gradient over time. $M_0$ equals zero at the times of the first and second gradient echoes. The $1^{st}$ moment $M_1$ of the readout magnetic field gradient is defined as the integral of the product of the readout magnetic field gradient and time over time. $M_1$ equals zero only at the time of the second gradient echo. This renders the gradient echo signals of the first gradient echo far more prone to flow artefacts than the gradient echo signals of the second gradient echo.

Figure 3:
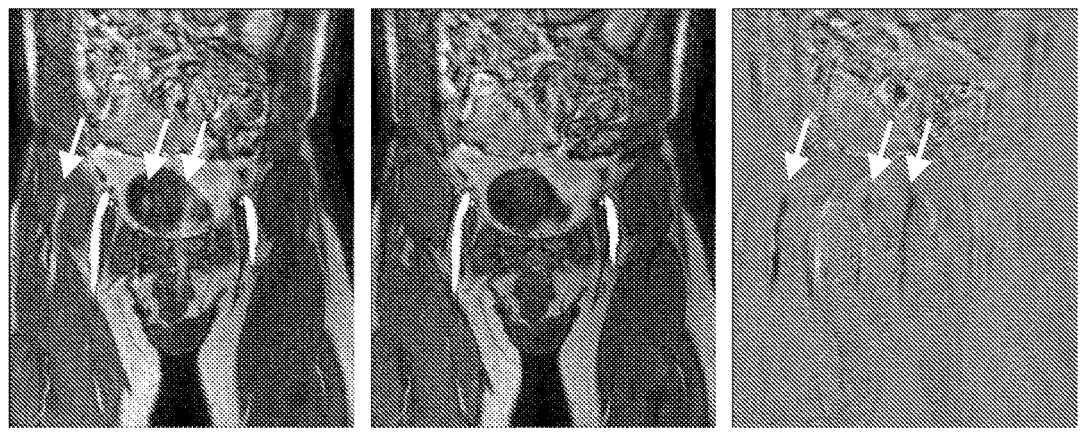
FIG. 3 shows first and second MR images reconstructed according to the invention, together with a difference image of the first and second MR images.

FIG. 3 shows first (left) and second (middle) MR images reconstructed from the gradient echo signals of the first gradient echo and the gradient echo signals of the second gradient echo respectively. The depicted first and second MR images are selected slices of a three-dimensional contrast-enhanced MR angiography acquisition. Substantial ghosting (indicated by white arrows) is present in the first MR image (left) as expected from the above discussion of the method of the invention. No ghosting artefacts can be seen in the second MR image (middle). The right image in FIG. 3 is the difference of the first (left) and second (middle) MR images. The difference image can be used for identifying the ghosting artefacts in the first MR image as the difference image shows local intensity losses as well as local intensity gains in the first MR image due to ghosting. The ghosting artefacts can then be eliminated in the first MR image by minimizing the identified intensity losses and gains.

The depicted MR images of the abdomen of a patient were acquired with a three-dimensional spoiled dual-gradient-echo sequence at a main magnetic field strength of 1.5 T, wherein the echo times of the first and second gradient echoes were 1.8 ms and 3.0 ms respectively. MR signals of water and fat are slightly more out of phase at the first echo time than at the second echo time.

Figure 4:
FIG. 4 shows water and fat images derived in a conventional manner from the first and second MR images shown in FIG. 3.

FIG. 4 shows a water MR image (left) and a fat MR image (right) derived from the first and second MR images shown in FIG. 2 using a conventional two-point Dixon separation method, i.e. without elimination of ghosting artefacts. As can be seen in FIG. 4, ghosting artefacts due to flow propagate into both images (white arrows).

Figure 5:
FIG. 5 shows water and fat images derived from the first and second MR images shown in FIG. 3 with eliminated ghosting artefacts according to the invention.

FIG. 5 shows a water MR image (left) and a fat MR image (right) derived again from the first and second MR images shown in FIG. 2, wherein use is made of the method of the invention for eliminating the ghosting artefacts. By detecting a decreased local image intensity in the second MR image compared to the first MR image and by eliminating the local image intensity losses in the first MR image, the ghosting artefacts are mostly suppressed. Since the echo times are selected such that the signal contributions from water and fat are more in phase at the time of the second gradient echo than at the time of the first gradient echo, water and fat rephase and thus cannot account for signal losses towards the second echo time. Thus, intensity losses can be attributed to ghosting artefacts that are present in the first MR image, but suppressed in the second MR image due to the gradient moment rephasing effect. By eliminating the identified ghosting artefacts, a significantly improved image quality is achieved as compared with the images shown in FIG. 4 without a prolongation of echo and repetition times.

The invention claimed is:

1. A method of MR imaging of a body placed in the examination volume of a MR device, the method comprising the steps of:
   a) generating at least two gradient echo signals at two different echo times by subjecting a portion of the body to an imaging sequence of RF pulses and switched magnetic field gradients, wherein the $0^{th}$ moment of the readout magnetic field gradient essentially vanishes at the time of the first gradient echo, the $1^{st}$ moment of the readout gradient being non-zero at the time of the first gradient echo, while both the $0^{th}$ and $1^{st}$ moments of the readout magnetic field gradient essentially vanish at the time of the second gradient echo;
   b) acquiring the gradient echo signals;
   c) repeating steps a) and b) for a plurality of phase encoding steps;
   d) reconstructing a first MR image from the gradient echo signals of the first gradient echo and a second MR image from the gradient echo signals of the second gradient echo; and
   e) identifying ghosting artefacts in the first and/or second MR image by comparing the first and second MR images.

2. The method of claim 1, wherein the ghosting artefacts are identified on the basis of local intensity losses and/or local intensity gains in the first MR image compared with the second MR image.

3. The method of claim 1, the ghosting artefacts are eliminated in the first and/or second MR image.

4. The method of claim 1, wherein at least one final MR image is computed by combining the first and second MR images.

5. The method of claim 1, wherein the gradient echo signals are part of a Dixon imaging method and comprise contributions from at least two chemical species having different MR spectra, wherein the echo times are selected such that the signal contributions from the at least two chemical species are more in phase at the time of the second gradient echo than at the time of the first gradient echo.

6. The method of claim 5, wherein the signal contributions of the at least two chemical species are separated such that the at least one final MR image comprises contributions from only one of the chemical species.

7. The method of claim 1, wherein generating the at least two gradient echo signals includes:
   following one of the RF pulses, applying switched magnetic field gradients including a first readout gradient pulse followed immediately by a second readout gradient pulse of opposite polarity to the first readout gradient pulse;
   wherein the time of the first echo being during the first readout gradient pulse when both the $0^{th}$ moment of the switched magnetic field gradient essentially vanishes and the $1^{st}$ moment of the switched magnetic field gradient is non-zero; and
   wherein the time of the second echo is during the second readout gradient pulse when both the $0^{th}$ and $1^{st}$ moments of the switched magnetic field gradients essentially vanish.

8. A magnetic resonance (MR) device comprising:
at least one main magnet coil configured to generate a uniform, steady magnetic field $B_0$ within an examination volume,
a number of gradient coils configured to generate switched magnetic field gradients in different spatial directions within the examination volume,
at least one RF coil configured to generate RF pulses within the examination volume and/or for receiving MR signals from a body of a patient positioned in the examination volume,
a control computer configured to control the at least one RF coil and the gradient coils to implement an imaging sequence including:
 a) subjecting a portion of the body disposed in the examination region to an RF pulse followed by switched magnetic field readout gradients including readout gradient pulses of alternating polarity such that a first gradient echo is formed during a first of the readout gradient pulses when a $0^{th}$ moment of the switched magnetic field readout gradients essentially vanishes and a $1^{st}$ moment of the switched magnetic field readout gradients is non-zero and a second gradient echo is formed during a second of the readout gradient pulses of opposite polarity to the first readout gradient pulse when both the $0^{th}$ and $1^{st}$ moments of the switched magnetic field readout gradients essentially vanish;
 b) acquiring the first and second gradient echo signals from the first and second gradient echoes;
 c) repeating steps a) and b) for a plurality of phase encoding steps to generate a plurality of first and second gradient echoes with different phase encodings; and
a reconstruction processor configured to:
 reconstruct a first MR image from the first gradient echo signals from the first gradient echo and a second MR image from the second gradient echo signals from the second gradient echo; and
 identify ghosting artefacts in the first and/or second MR image by comparing the first and second MR images.

9. The MR device of claim 8, wherein the first and second echoes include contributions from first and second chemical species having different MR spectra, and wherein the RF pulses and the switched magnetic field gradients are timed such that signal contributions from the first and second chemical species are more in phase in one of the first and second gradient echoes than in the other of the first and second gradient echoes, and further including:
 at least one of additively combining the first and second images to generate a first species image and subtractively combining the first and second images to generate a second species image.

10. A non-transitory computer-readable medium carrying software code for controlling one or more computer processors of a magnetic resonance imaging device to generate an imaging sequence including:
 a) subjecting a portion of a subject disposed in an examination region to an RF pulse followed by switched magnetic field readout gradients to induce a first gradient echo formed when a $0^{th}$ moment of the switched magnetic field readout gradients essentially vanishes and a $1^{st}$ moment of the switched magnetic field readout gradients is non-zero and a second gradient echo is formed when both the $0^{th}$ and $1^{st}$ moments of the switched magnetic field readout gradients essentially vanish;
 b) acquiring first and second gradient echo signals from the first and second gradient echoes;
 c) repeating steps a) and b) for a plurality of phase encoding steps to generate a plurality of first and second gradient echoes with different phase encodings;
 d) reconstructing a first magnetic resonance image from the first gradient echo signals and a second magnetic resonance image from the second gradient echo signals; and
 e) comparing the first and second magnetic resonance images to identify ghosting artifacts.

11. The non-transitory computer-readable medium of claim 10, wherein the first and second echoes include contributions from first and second chemical species having different MR spectra, and wherein the RF pulses and the switched magnetic field gradients are timed such that signal contributions from the first and second chemical species are more in phase in one of the first and second gradient echoes than in the other of the first and second gradient echoes, and the computer software is further configured to control the one or more processors of the magnetic resonance imaging device to:
 at least one of additively combining the first and second images to generate a first species image and subtractively combining the first and second images to generate a second species image.

* * * * *